(12) United States Patent
Rhee

(10) Patent No.: US 7,461,361 B2
(45) Date of Patent: Dec. 2, 2008

(54) METHOD OF CREATING CORE-TILE-SWITCH MAPPING ARCHITECTURE IN ON-CHIP BUS AND COMPUTER-READABLE MEDIUM FOR RECORDING THE METHOD

(75) Inventor: Chae-Eun Rhee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 464 days.

(21) Appl. No.: 11/247,731

(22) Filed: Oct. 11, 2005

(65) Prior Publication Data

US 2006/0161875 A1 Jul. 20, 2006

(30) Foreign Application Priority Data

Jan. 6, 2005 (KR) .................... 10-2005-0001123

(51) Int. Cl.
*G06F 17/50* (2006.01)
(52) U.S. Cl. ................ 716/2; 716/12; 716/14; 716/17
(58) Field of Classification Search ............ 716/2, 716/11, 14, 17
See application file for complete search history.

(56) References Cited

U.S. PATENT DOCUMENTS

| | | | |
|---|---|---|---|
| 5,974,487 A | 10/1999 | Hartmann | |
| 7,000,212 B2 * | 2/2006 | Agrawal et al. | ............. 716/17 |
| 2004/0157569 A1 | 8/2004 | Carballo et al. | |

FOREIGN PATENT DOCUMENTS

KR 1020030095083 A 12/2003

OTHER PUBLICATIONS

Kumar et al., "A Network on Chip Architecture and Design Methodology," Proceedings of the IEEE Computer Society Annual Symposium on VLSI (2002), 8 pages.

* cited by examiner

*Primary Examiner*—Thuan Do
(74) *Attorney, Agent, or Firm*—Myers Bigel Sibley & Sajovec

(57) ABSTRACT

There are provided a method of creating an optimized core-tile-switch mapping architecture in an on-chip bus and a computer-readable recording medium for recording the method. The core-tile-switch mapping architecture creating method includes: creating a core communication graph representing the connection relationship between arbitrary cores; creating a Network-on-chip (NOC) architecture including a plurality of switches, a plurality of tiles, and a plurality of links interconnecting the plurality of switches; and mapping the cores to the tiles using a predetermined optimized mapping method to thereby create the optimized core-tile-switch mapping architecture. The optimized mapping method includes first, second, and third calculating steps. According to the optimized core-tile-switch mapping architecture creating method and the computer-readable recording medium for recording the method, since the hop distance between cores is minimized, it is possible to minimize energy consumption and communication delay time in an on-chip bus. Furthermore, the optimized mapping architecture presents a standard for comparing the optimization of other mapping architectures.

20 Claims, 5 Drawing Sheets

2-D MESH NoC ARCHITECTURE

METHOD OF CREATING CORE-TILE-SWITCH MAPPING ARCHITECTURE IN ON-CHIP BUS AND COMPUTER-READABLE MEDIUM FOR RECORDING THE METHOD

REFERENCE TO PRIORITY APPLICATION

This application claims the benefit of Korean Patent Application No. 2005-0001123, filed on Jan. 6, 2005, in the Korean Intellectual Property Office, the disclosure of which is hereby incorporated herein by reference.

FIELD OF THE INVENTION

The present invention related to integrated circuit manufacturing methods and, more particularly, to methods of designing high density integrated circuit chips with multiple functional logic blocks.

BACKGROUND OF THE INVENTION

Conventional chip sets, where separate chips each execute their own functions, are evolving toward system-on-chip technology, where various functional blocks are integrated on a single chip. The system-on-chip may integrate a variety of functional blocks on a single chip, including a microprocessor, an on-chip memory, an audio and video controller, a CODEC, a digital signal processor. Such integration may reduce the size of a product and decrease the development time and cost.

The functional blocks constructing the system-on-chip can be separately developed if required. Otherwise, blocks that have been developed by specialized developers can be used. This reusability of blocks can reduce the time and cost required for developing them.

Sometimes, blocks within a functional system-on-chip require a high data bandwidth, which increases the burden on transmission and reception of data among the cores. For example, in the case of a system-on-chip including a large-capacity on-chip memory and a controller for processing audio and video signals or a CODEC, considerable time and cost are required for designing the architecture of data transmission and reception between the functional blocks in the chip.

Generally, buses are used for transferring data between a large number of chips. In an embedded system using an ARM CPU, for example, components such as the CPU, a memory controller, a display controller and so on are interconnected using a bus architecture such as AMBA (Advanced Microprocessor Bus Architecture).

The system-on-chip has been evolving toward integration of functional blocks on a single chip, and interconnection of the cores has been developing toward using the bus architecture. Thus, a conventional low-integration system-on-chip employs a chip-level bus architecture without modification. However, as the integration of the system-on-chip is increased, the wires of the bus become narrower, and the characteristics of the wires, such as inductance, resistance, capacitance and so on, become significant compared to the sizes of gates within the functional blocks. Accordingly, it may be difficult to obtain desired system performance when the conventional bus architecture is applied to the system-on-chip.

To address these limitations, a network-on-chip has been developed, which is a technical field including efficient on-chip bus architecture and design methodology for the system-on-chip, and on-chip buses in a variety of architectures have been recently proposed. FIG. 1 illustrates a conventional on-chip bus architecture 100. This on-chip bus architecture was obtained by modifying a part of the bus architecture disclosed in U.S. Pat. No. 5,974,487. The on-chip bus architecture 100 can be used for a system-on-chip including nine functional block cores. Referring to FIG. 1, the on-chip bus architecture 100 includes nine cores 110a through 110i, which are the various functional blocks, switches 120a through 120l used for communication between the cores 110a through 110i, and links 130a through 130l and 131a through 131h for interconnecting the switches 120a through 120l. The links 130a through 130l and 131a through 131h and the switches 120a through 120l are configured in a ring topology, the rings of which form a two-dimensional mesh of the bus architecture. In this case, the switches 120a through 120l are positioned at the intersections of the mesh of rings. Each switch receives data from one switch through a link, and transfers it to another switch through another link. Furthermore, each switch transfers data through a link to a core, and transfers data from the core to other cores via other switches.

Here, a link can connect switches bi-directionally or uni-directionally. A bi-directional link can be constructed of a pair of uni-directional wires that transfer data in opposite directions. Otherwise, the bi-directional link can be composed of a single wire. When the core 110a has data that must be transmitted to the core 110e, the core 110a transmits the data to the switch 120a. The switch 120a transfers the data received from the core 110a through the link 131a to the switch 120d. Finally, the switch 120d transfers the data received through the link 131a to the core 110e. That is, in the on-chip bus architecture 100 of FIG. 1, data transmission and reception between cores is carried out through links connecting switches connected to the cores.

FIG. 2 shows a diagram for explaining mapping among cores, tiles and switches. In particular, FIG. 2 illustrates a core-communication graph and a network-on-chip architecture. The core-communication graph identifies that cores 210 which will be interconnected in order to construct the on-chip bus architecture 100 of FIG. 1. In FIG. 2, a core s is connected to cores d and d'. Here, cores mean functional blocks of a system-on-chip, such as memories, processors and so on. The network-on-chip architecture includes a plurality of switches 230, a plurality of tiles 220, and a plurality of links connecting the plurality of switches 230, and decides the connection of the tiles 220 and the switches 230. The tiles 220 are spaces where the cores are mounted, and are connected to the switches 230.

In FIG. 2, the core s is mapped to a tile k, the core d is mapped to a tile l, and the core d' is mapped to a tile l'. One of switches surrounding the tile k is a switch i, and one of switches surrounding the tile l is a switch j. FIG. 2 shows data communication routes x and y from the switch i to the switch j.

In the construction of the on-chip bus architecture 100 of FIG. 1, a mapping relationship for which switches are connected to tiles is most important. Energy consumption and communication delay time for transmission and reception of data between two cores in the mesh-based on-chip bus architecture are proportional to the hop distance between the two cores. Accordingly, a tile-switch mapping method capable of minimizing the hop distance required for transmission and reception of data is needed. However, conventional tile-switch mapping methods typically consider only one-to-one mapping among, cores, tiles, and switches.

Furthermore, the conventional mapping methods do not propose an optimized mapping architecture for reducing energy consumption and communication delay time required for transmission and reception of data between cores, because they decide core-tile-switch mapping according to rules of thumb. Accordingly, a core-tile-switch mapping method is required that decides the mapping relationship among cores, tiles, and switches to minimize the hop distance needed for transmission and reception of data between cores, to thereby minimize energy consumption and communication delay time.

SUMMARY OF THE INVENTION

Embodiments of the invention include a method of creating an optimized core-tile-switch mapping architecture in an on-chip bus. The method includes creating a core communication graph representing a connection relationship between arbitrary cores and creating a Network-on-chip (NOC) architecture including a plurality of switches, a plurality of tiles, and a plurality of links interconnecting the plurality of switches. The method also includes mapping the cores to the tiles using a predetermined optimized mapping method and creating the optimized core-tile-switch mapping architecture. The optimized mapping method may include a first step of multiplying a data communication flow from an arbitrary core s to an arbitrary core d by a hop distance between an arbitrary switch i and an arbitrary switch j. The values of the switches i and j are changed to the values of switches surrounding an arbitrary tile k and switches surrounding an arbitrary tile l. The multiplication is carried out for the changed values, and then the multiplication result values are summed up. A second step of carrying out the calculation of the first step for all tiles and then summing up the result values is performed. A third step of multiplying a communication volume from the core s to the core d by the result value of the second step, in which values of the cores s and d are changed to the values of all cores is also performed. This multiplication is carried out for the changed values, and the multiplication result values are summed up, to thereby decide the cores s and d which minimize the hop distance between the switches i and j. The method further includes a fourth step of dividing the result value of the third step by the communication volume between the cores s and d carried out for the values of all cores, to thereby decide the cores s and d which minimizes an average hop distance from the switch i to the switch j.

The first through fourth steps assume that the switch i as one of the switches surrounding the arbitrary tile k is connected to the tile k and the arbitrary switch j as one of the switches surrounding the tile l is connected to the tile l, when the core s is mapped to the tile k and the core d is mapped to the tile l.

The optimized mapping method is represented as follows:

$$\frac{1}{\sum_{\forall s,d} v_{sd}} \sum_{\forall s,d} v_{sd} \sum_{\forall k,l} \sum_{\forall i \in S_k, \forall j \in S_l} h_{ij} f_{skdl}^{ij}$$

where $f_{skdl}^{ij}$ is the data communication flow, $h_{ij}$ is the hop distance between the switches i and j, $S_k$ and $S_l$ respectively represent the switches surrounding the tile k and the switches surrounding the tile l, and $v_{sd}$ represents the communication volume between the cores s and d.

The number of cores is equal to or less than the number of tiles and no more than one core is mapped to a single tile. A relationship between the core and the tile is represented as follows $$\sum_{\forall k} m_{sk} = 1, \sum_{\forall s} m_{sk} \leq 1$$

where, $$\sum_{\forall k} m_{sk} = 1$$

means that the number of tiles k mapped to the core s is 1, and $$\sum_{\forall s} m_{sk} \leq 1$$

means that the number of cores s mapped to the tile k is 1 or 0.

The number of switches connected to a single core is from 1 to 4.

A relationship between the cores and the switches is represented as follows:

$$m_{sk} \leq \sum_{\forall i \in S_k} m_{sk}^i \leq D_C m_{sk}$$

where $D_c$ represents the maximum number of switches connected to a single core, $m_{sk}$ is 1 if the core s is mapped to the tile k and is 0 otherwise, and $m_{sk}^i$ represents the number of switches connected to the tile k in the state that the core s is mapped to the tile k.

The data communication flow is 1 if the core s is mapped to the tile k connected to the switch i and the core d is mapped to the tile l connected to the switch j, and is 0 otherwise.

The data communication flow is represented by the following Expression:

$$\sum_{\forall i \in S_k, \forall j \in S_l} f_{skdl}^{ij} \sum_{\forall i \in S_k, \forall j \in S_l} f_{skdl}^{ij} = 1, \text{ if } m_{sk} = 1 \text{ and } m_{dl} = 1,$$

$$\sum_{\forall i \in S_k, \forall j \in S_l} f_{skdl}^{ij} \sum_{\forall i \in S_k, \forall j \in S_l} f_{skdl}^{ij} = 0 \text{ otherwise}$$

where $m_{sk}$ represents the case where the core s is mapped to the tile k and $m_{dl}$ represents the case where the core d is mapped to the tile l.

The Expression is represented as the following linear Expression:

$$m_{sk} + m_{dl} - 1 \leq \sum_{\forall i \in S_k, \forall j \in S_l} f_{skdl}^{ij} \leq \frac{m_{sk} + m_{dl}}{2}$$

where the middle term of the Expression is 1 if the core s is mapped to the tile k connected to the switch i and the core d is mapped to the tile l connected to the switch j.

The bandwidth of an arbitrary link is equal to or smaller than the maximum bandwidth that can be simultaneously congested in the link, and the maximum bandwidth of the link does not exceed the link capacity.

The bandwidth of the arbitrary link is represented as follows $$\sum_{\forall s,d} \sum_{\forall k,l} \sum_{\forall i,j} b_{sd} r_{xy}^{ij} f_{skdl}^{ij} = B_{xy}, B_{xy} \leq B_{max}, B_{max} \leq C,$$

where, $B_{xy}$ is the bandwidth of the link between arbitrary routes X and Y between the switches i and j, $b_{sd}$ denotes the bandwidth required for the data communication flow from the core s to the core d, $B_{max}$ represents the maximum bandwidth which can be simultaneously congested in the arbitrary link, and C denotes the link capacity that is the maximum data capacity which the arbitrary link can transmit.

According to another embodiment of the present invention, there is provided a computer-readable recording medium for recording a method of creating an optimized core-tile-switch mapping architecture in an on-chip bus using a core communication graph and a Network-on-chip (NOC) architecture, which is a two-dimensional architecture. The method includes the above-described steps.

DETAILED DESCRIPTION OF THE INVENTION

Hereinafter, embodiments of the present invention will be described in detail with reference to the appended drawings. Like reference numbers refer to like components throughout the drawings.

Figure 1:
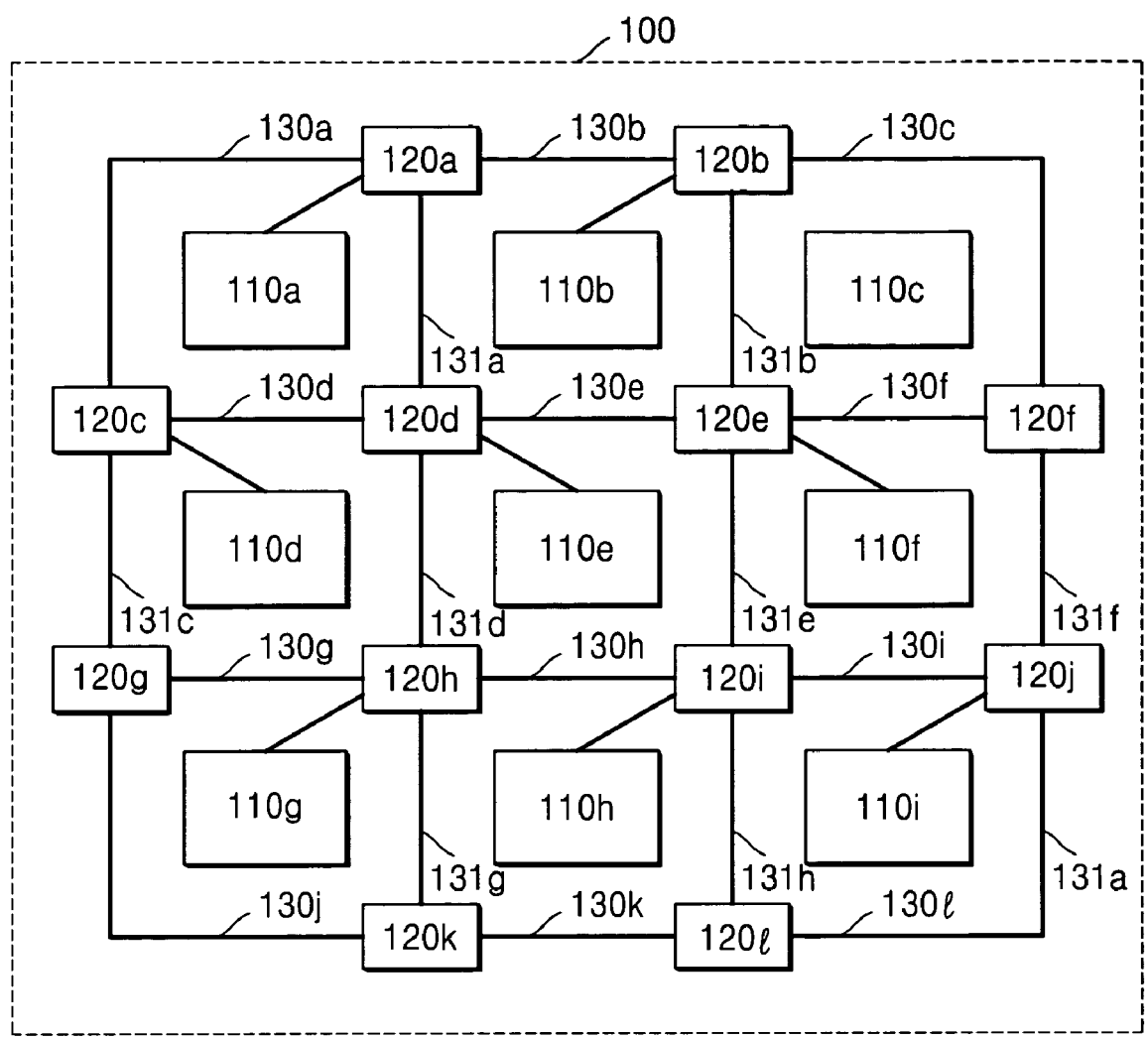
FIG. 1 is a block diagram of a conventional on-chip bus architecture.
Figure 2:
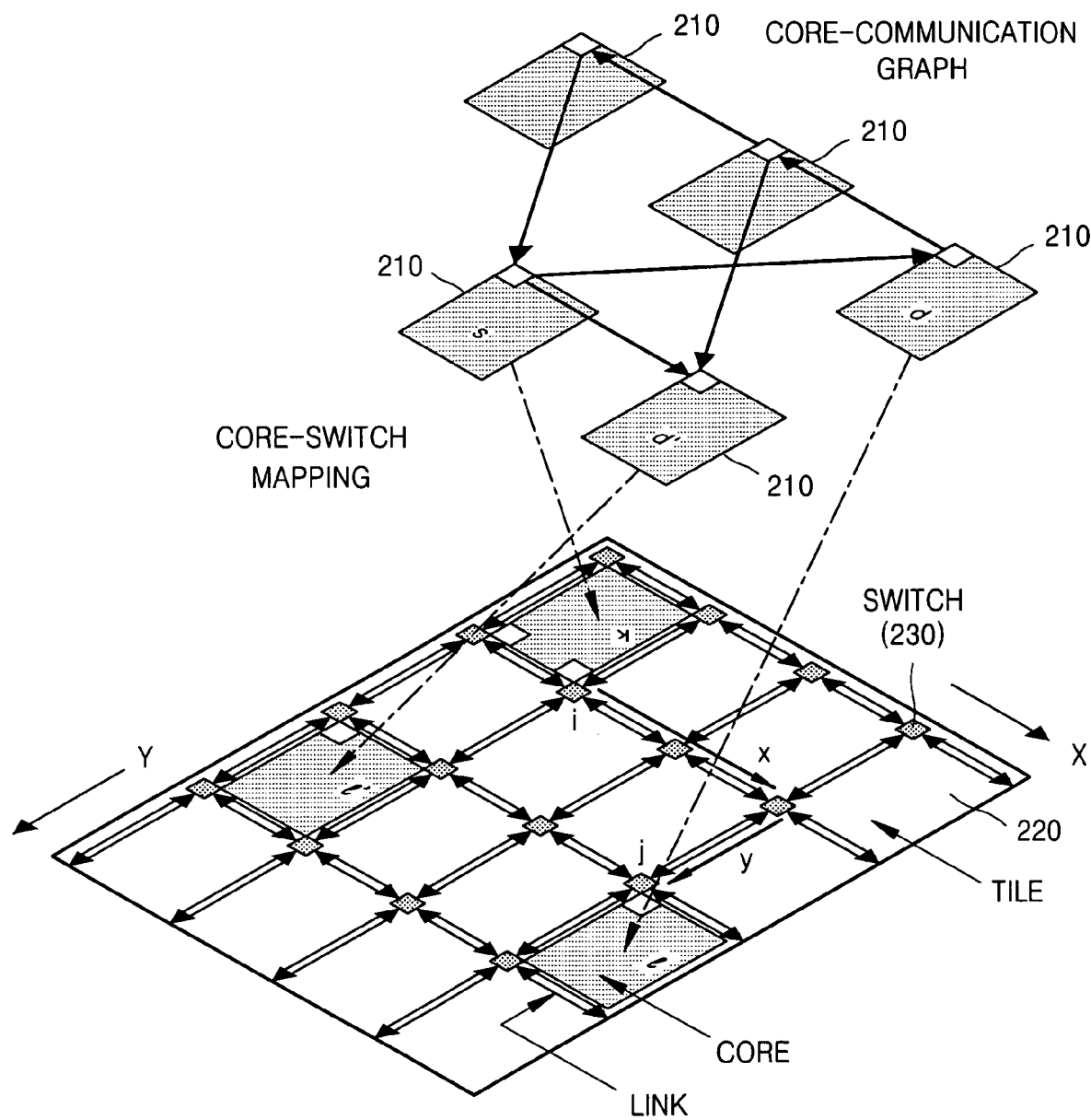
FIG. 2 is a diagram for explaining mapping between cores, tiles, and switches.
Figure 3:
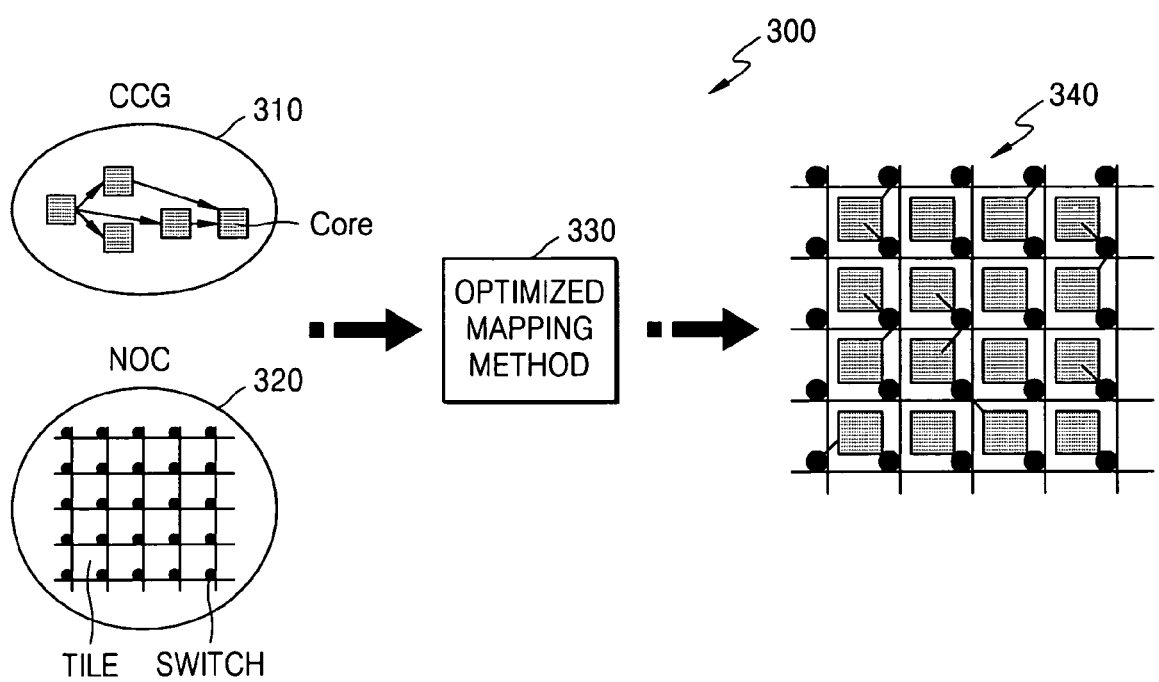
FIG. 3 is a diagram for explaining a method of creating a core-tile-switch mapping architecture according to an embodiment of the present invention.
Figure 4:
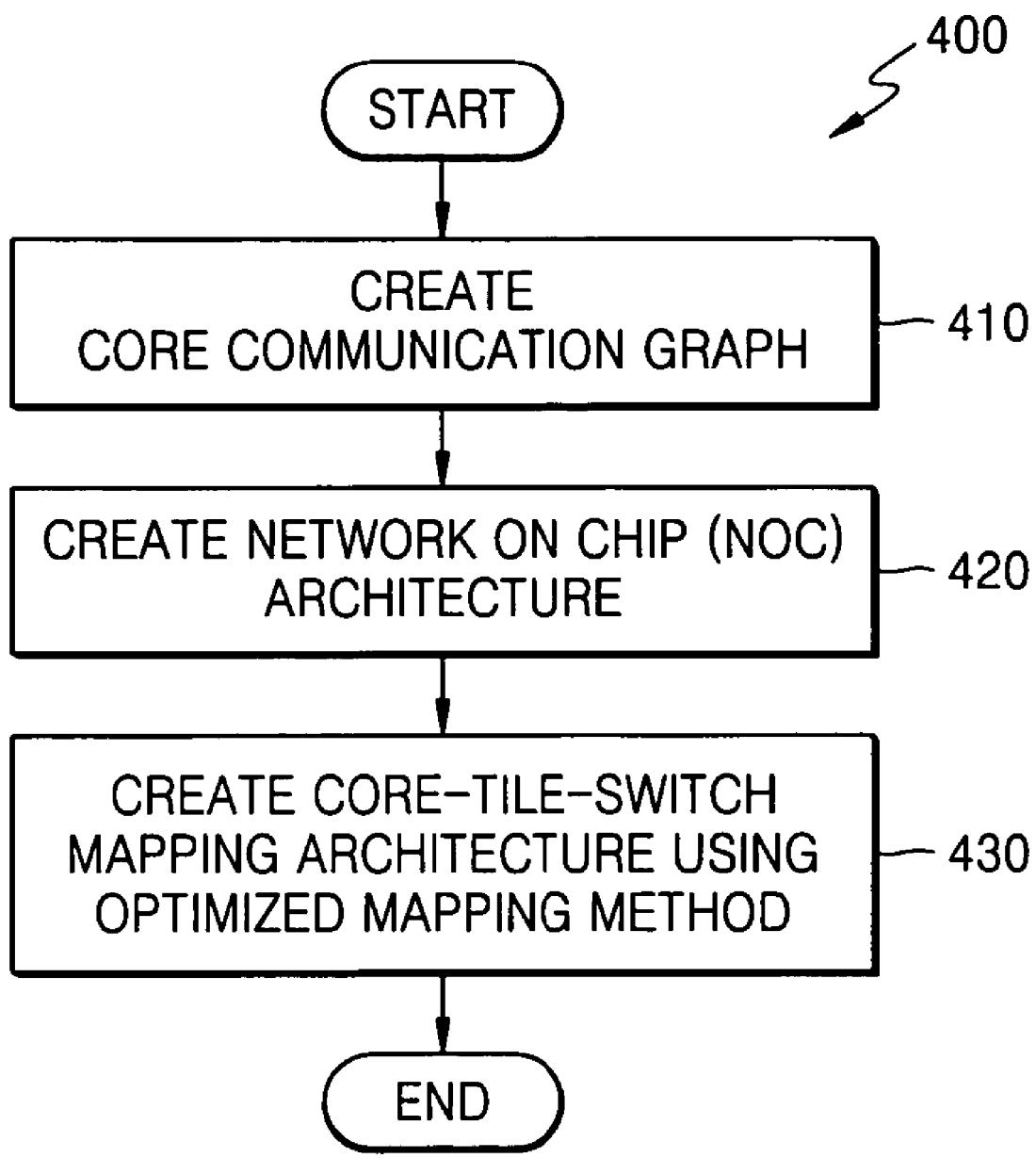
FIG. 4 is a flowchart illustrating the method of creating the core-tile-switch mapping architecture according to an embodiment of the present invention.

FIG. 3 is a diagram for explaining a method of creating a core-tile-switch mapping architecture according to an embodiment of the present invention. FIG. 4 is a flowchart illustrating the method of creating the core-tile-switch mapping architecture according to an embodiment of the present invention.

Referring to FIGS. 3 and 4, first, a core communication graph (CCG) 310 representing the connection relationship between arbitrary cores is created (operation 410). The connection relationship between arbitrary cores can be set by a designer of a system-on-chip. In the following descriptions, for the convenience of description, it is assumed that an arbitrary core s is connected to another arbitrary core d. Then, a network-on-chip (NOC) architecture 320 including a plurality of switches, a plurality of tiles, and a plurality of links interconnecting the plurality of switches is created (operation 420). Here, for the convenience of description, it is assumed that the NOC architecture 320 is a two-dimensional mesh architecture. However, the NOC architecture 320 is not limited to the two-dimensional mesh architecture.

After the core communication graph 310 and the NOC architecture 320 are created, cores are mapped to corresponding tiles of a predetermined optimized mapping method 330 based on the core communication graph 310 and the NOC architecture 320, so as to create an optimized core-tile-switch mapping architecture 340 (operation 430).

The core-tile-switch mapping architecture 340 obtained by the optimized mapping method 330 can minimize the hop distance between the cores s and d, thereby reducing the energy consumption and communication delay time required for transmission and reception of data. The core-tile-switch mapping architecture 340 is obtained by the optimized mapping method 330 according to an embodiment of the present invention, differently from a conventional core-tile-switch mapping architecture obtained according to rules of thumb.

Figure 5:
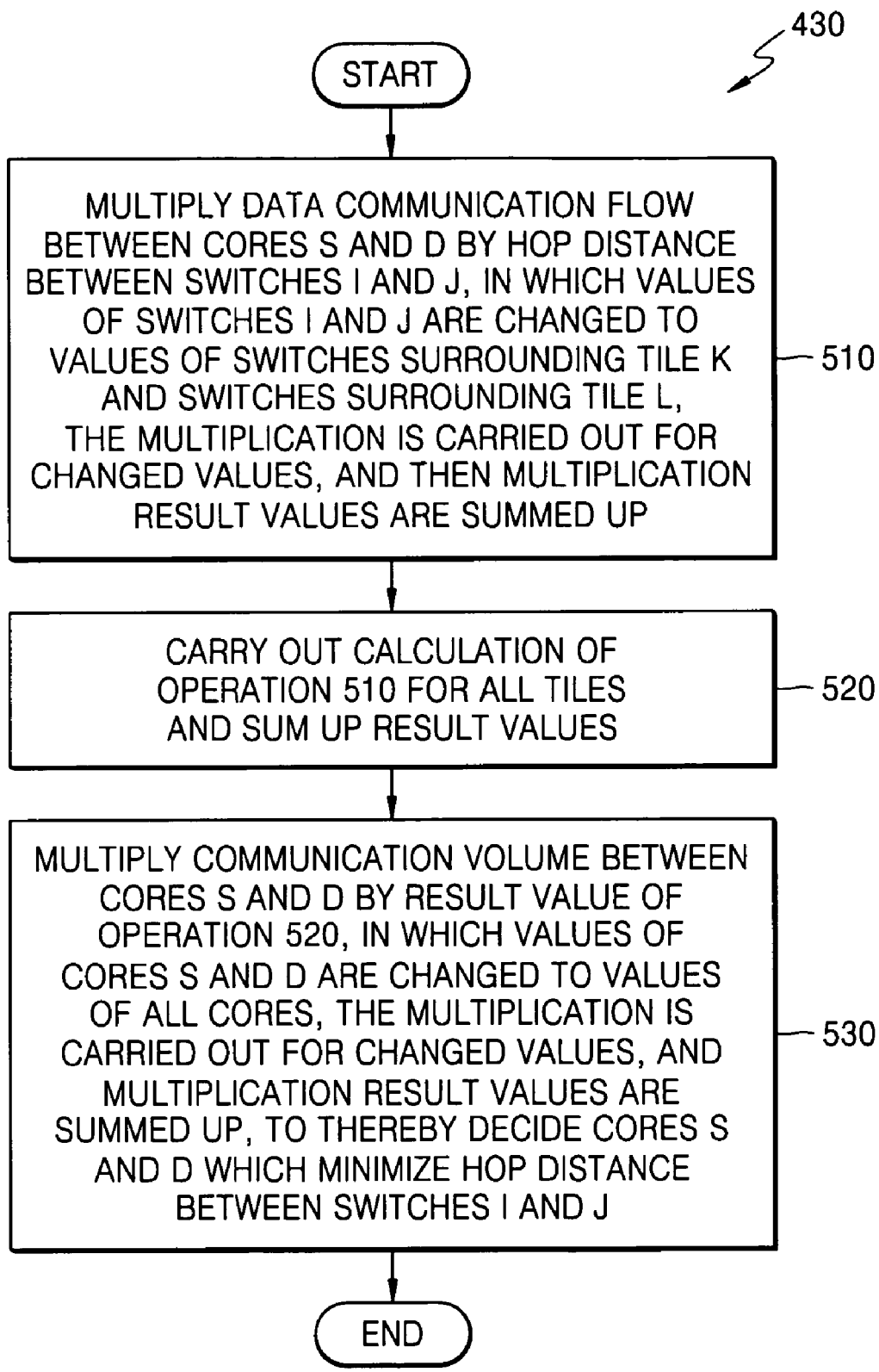
FIG. 5 is a flowchart illustrating in detail an optimized mapping method.

Now, the optimized mapping method 330 will be described in detail with reference to FIG. 5, which is a flowchart illustrating in detail the optimized mapping method 330. Referring to FIG. 5, operation 430 of creating an optimized core-tile-switch mapping architecture using the optimized mapping method 330 includes first, second, and third steps 510, 520, and 530. For the convenience of description, it is assumed that an optimized core-tile-switch mapping architecture is an architecture where an arbitrary switch i as one of switches surrounding an arbitrary tile k is connected to the arbitrary tile k, an arbitrary switch j as one of switches surrounding an arbitrary tile I is connected to the arbitrary tile I, an arbitrary core s is mapped to the tile k, and another arbitrary core d is mapped to the tile I.

The optimized mapping method 330 is used for creating an optimized core-tile-switch mapping architecture of connecting an arbitrary core s to another arbitrary core d so that energy consumption and communication delay time can be minimized. In the present embodiment, it is assumed that an architecture where a core s is connected to a tile k and a switch i and a core d is connected to a tile I and a switch j is an optimized core-tile-switch mapping architecture.

The optimized mapping method 330 can be represented as follows.

$$\frac{1}{\sum_{\forall s,d} v_{sd}} \sum_{\forall s,d} v_{sd} \sum_{\forall k,l} \sum_{\forall i \in S_k, \forall j \in S_l} h_{ij} f_{skdl}^{ij} \quad (1)$$

If the calculation of Expression (1) is performed while varying the values of the cores s and d, the tiles k and l, and the switches i and j, a plurality of result values are obtained. These result values correspond to hop distances between the cores s and d. Accordingly, values of cores s and d, tiles k and l, and switches i and j which can obtain the minimum value of the result values, form the optimized mapping architecture.

In the operation 430 of creating the optimized core-tile-switch mapping architecture using the optimized mapping method 330, the first step 510 will now be explained. The first step 510 multiplies a data communication flow from the core s to the core d by the hop distance between the switches i and j. Specifically, the first step 510 changes the values of the switches i and j to the values of switches surrounding the tile k and switches surrounding the tile l, carries out the multiplication for the changed values, and then adds up the multiplication result values.

The first step 510 performs the rightmost summing operation (sigma operation) of Expression 1. In Expression 1, $f_{skdl}^{ij}$ represents the data communication flow and $h_{ij}$ denotes the hop distance between the switches i and j. In addition, $S_k$ and $S_l$ respectively represent the switches surrounding the tile k and the switches surrounding the tile l. There may be a plurality of switches that surround the tiles k and l. The switches i and j are selected from the switches surrounding the tiles k and l to calculate the data communication flow and the hop distance, and the two values are multiplied together.

Then, the values of the switches i and j are changed to the values of the switches surrounding the tiles k and l, data communication flows and hop distances for the changed values are calculated, and each data communication flow is multiplied by a corresponding hop distance.

In the present embodiment, if the network-on-chip architecture has a two-dimensional mesh architecture, there are four switches surrounding each of the tiles k and l. Thus, if the calculation of the first step is carried out for the switches i and j, four result values are obtained and these four result values are summed up by the summing operation (sigma operation).

The data communication flow is 1 if the tile k to which the core s is mapped is connected to the switch i and the tile l to which the core d is mapped is connected to the switch j, but is 0 otherwise.

The case where the tile k to which the core s is mapped is connected to the switch i and the tile l to which the core d is mapped is connected to the switch l has been assumed to be the optimized tile-core-switch mapping architecture. Accordingly, the data communication flow is 1 in the optimized tile-core-switch mapping architecture and is 0 in different architectures.

The data communication flow can be represented by Expression 2.

$$\sum_{\forall i \in S_k, \forall j \in S_l} f^{ij}_{skdl} \sum_{\forall i \in S_k, \forall j \in S_l} f^{ij}_{skdl} = 1, \text{ if } m_{sk} = 1 \text{ and } m_{dl} = 1, \quad (2)$$

$$\sum_{\forall i \in S_k, \forall j \in S_l} f^{ij}_{skdl} \sum_{\forall i \in S_k, \forall j \in S_l} f^{ij}_{skdl} = 0 \text{ otherwise}$$

where, $m_{sk}$ represents the case where the core s is mapped to the tile k and $m_{dl}$ represents the case where the core d is mapped to the tile l. Expression 2, which is non-linear, can be represented by Expression 3, which is linear.

$$m_{sk} + m_{dl} - 1 \leq \sum_{\forall i \in S_k, \forall j \in S_l} f^{ij}_{skdl} \leq \frac{m_{sk} + m_{dl}}{2} \quad (3)$$

where, if the core s is mapped to the tile k connected to the switch i and the core d is mapped to the tile l connected to the switch j, the middle term of Expression 3, that is, the data communication flow, is 1.

In the present embodiment, because the core s is mapped to the tile k, $m_{sk}$ is 1. If the core s is mapped to a different tile, $m_{sk}$ is 0. Also, in the present embodiment, because the core d is mapped to the tile l, $m_{dl}$ is 1. Likewise, if the core d is mapped to a different tile, $m_{dl}$ is 0. Therefore, in the optimized architecture where the tile k to which the core s is mapped is connected to the switch i and the tile l to which the core d is mapped is connected to the switch j, because the left and right terms of Expression 3 are all 1, the middle term of Expression 3 also becomes 1.

The second step 520 carries out the calculation of the first step 510 for all tiles and sums up the result values. The second step 520 performs the second summing operation (sigma operation) of Expression 1, including the calculation of the first step 510. That is, the values of the arbitrary tiles k and l are changed to the values of all tiles and the calculation of the first step 510 is carried out for the changed values. Accordingly, hop distances and communication data flows are calculated for all tiles and all switches surrounding the tiles and each communication data flow is multiplied by a corresponding hop distance.

The third step 530 multiplies each of the multiplication result values obtained after the second step 520 by a communication volume $v_{sd}$ from the core s to the core d. Specifically, the third step 530 carries out the calculation of the second step 520 for all cores and then sums up the result values. The third step performs the third summing operation (sigma operation) of Expression 1, including the operation of the second step 520. In Expression 1, a communication volume from the core s to the core d is denoted by $v_{sd}$.

Specifically, the calculations of the first and second steps 510 and 520 are carried out while varying the values of the cores s and d to the values of all cores. Thus, hop distances and communication data flows are calculated for all cores, all tiles, and all switches surrounding the tiles, and each communication flow is multiplied by a corresponding hop distance.

Then, each multiplication result value is multiplied by the communication volume $v_{sd}$. The communication volume $v_{sd}$ is a value regarding the amount of data communication between the cores s and d and functions as a type of weight. The values obtained by these calculations are summed up to acquire the minimum hop distance between the switches i and j. Here, the switch i is connected to the tile k to which the core s is mapped, and the switch j is connected to the tile l to which the core d is mapped. The architecture of mapping the cores, tiles, and switches which corresponds to the minimum hop distance forms the optimized tile-switch mapping architecture capable of minimizing energy consumption and communication delay time.

The optimized mapping method 330 can further include a fourth step which divides the result value of the third step 530 by the communication volume between the cores s and d, which has been carried out for all cores, to decide the cores s and d for which the average hop distance between the switches i and j is minimum.

The first through fourth steps are executed under the following conditions. First of all, restrictions on mapping of cores and tiles are described. The number of cores is equal to or less than the number of tiles and no more than one core is mapped to a single tile. That is, one core is mapped to one tile. In other words, one tile is mapped to one core or not mapped to any core.

The relationship between cores and tiles can be represented by Expression 4.

$$\sum_{\forall k} m_{sk} = 1, \sum_{\forall s} m_{sk} \leq 1 \quad (4)$$

where, $$\sum_{\forall k} m_{sk} = 1$$

means that the number of tiles k which can be mapped to a core s is 1, and $$\sum_{\forall s} m_{sk} \leq 1$$

means that the number of cores s which can be mapped to a tile k is 1 or 0.

Restrictions on cores and switches will now be explained. The number of switches which can be connected to a single core is from 1 to 4. The relationship between cores and switches can be represented by Expression 5.

$$m_{sk} \leq \sum_{\forall i \in S_k} m^i_{sk} \leq D_C m_{sk} \qquad (5)$$

where $D_c$ denotes the maximum number of switches connected to a core, and $1 \leq D_c \leq 4$ when the network-on-chip (NOC) is a two-dimensional mesh architecture. In addition, $m_{sk}$ is 1 if the core s is mapped to the tile k, but is 0 otherwise. $m_{sk}^i$ as the middle term of Expression 5 represents the number of switches which can be connected to the tile k in the state that the core s is mapped to the tile k. If the core is mapped to the tile k, $m_{sk}^i$ is a value from 1 to 4. Accordingly, the number of switches connected to a single core is from 1 to 4.

Another restrictions on cores and switches will be explained below. The number of cores which can be connected to a switch is from 1 to 4.

The relationship between cores and switches can be represented by Expression 6.

$$0 \leq \sum_{\forall k \in T_i} \sum_{\forall s} m^i_{sk} \leq D_S \qquad (6)$$

where $D_s$ represents the maximum number of cores which can be connected to a switch, and $1 \leq D_c \leq 4$ if the network-on-chip (NOC) is a two-dimensional mesh architecture. $m_{sk}^i$ represents the number of switches which can be connected to the tile k in the state where the core s is mapped to the tile k. The middle term of Expression 6 becomes a value between 0 and 4. Accordingly, the number of cores which can be connected to a switch is from 0 to 4.

Restrictions on an arbitrary link bandwidth will now be explained. The bandwidth of an arbitrary link should be equal to or smaller than the maximum bandwidth which can be simultaneously congested in the link. Furthermore, the maximum bandwidth of the arbitrary link must not exceed the link capacity. The bandwidth of the link can be represented by Expression 7.

$$\sum_{\forall s,d} \sum_{\forall k,l} \sum_{\forall i,j} b_{sd} r^{ij}_{xy} f^{ij}_{skdl} = B_{xy}, \ B_{xy} \leq B_{max}, \ B_{max} \leq C \qquad (7)$$

where $B_{xy}$ represents the bandwidth of the link between arbitrary routes X and Y between the switches i and j, $b_{sd}$ represents the bandwidth required for the data communication flow from the core s to the core d, $B_{max}$ represents the maximum bandwidth which can be simultaneously congested in the link, and C represents the link capacity.

The link between the switches i and j connecting the core s with the core d must have a sufficient bandwidth for transmitting and receiving data. The bandwidth $B_{xy}$ of the link between the routes X and Y must be smaller than the maximum bandwidth $B_{max}$. Furthermore, the maximum bandwidth $B_{max}$ must be smaller than the maximum data capacity C the link can transmit. In Expression 5, $r_{xy}^{ij}$ is 1 if the routes X and Y exist between the switches i and j, and is 0 otherwise.

Based on the aforementioned conditions and the first through fourth steps, the optimized core-tile-switch mapping architecture capable of minimizing energy consumption and communication delay time can be found. In the meantime, the present invention can also be embodied as computer readable code on a computer readable recording medium. The computer readable recording medium is any data storage device that can store data which can be thereafter read by a computer system. Examples of the computer readable recording medium include ROM, RAM, CD-ROM, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

As described above, the method of creating the optimized tile-switch mapping architecture and the computer-readable recording medium for recording the method minimizes the hop distance between cores, to thereby minimize energy consumption and communication delay time in an on-chip bus. Furthermore, the optimized mapping architecture presents a standard for comparing the optimization of other mapping architectures.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of designing an integrated circuit chip, comprising the steps of:
    generating a core communication graph identifying an electrical interconnection relationship between a plurality of cores to be provided on the integrated circuit chip;
    generating a network-on-chip architecture including at least a plurality of switches, a plurality of tiles and a plurality of links interconnecting the plurality of switches; and
    generating a core-tile-switch mapping architecture on the integrated circuit chip by mapping the plurality of cores to the plurality of tiles using a mapping method, said mapping method comprising:
    multiplying a data communication flow from a first one of the plurality of cores to a second one of the plurality of cores by a hop distance measured between a first one of the plurality of switches and a second one of the plurality of switches, to thereby yield a plurality of multiplication result values; and summing the plurality of multiplication result values.

2. A computer program product comprising a computer-readable storage medium having computer-readable program code embodied in said medium, said computer-readable program code comprising:

computer-readable program code that generates a core communication graph identifying an electrical interconnection relationship between a plurality of cores to be provided on the integrated circuit chip;

computer-readable program code that generates a network-on-chip architecture including at least a plurality of switches, a plurality of tiles and a plurality of links interconnecting the plurality of switches; and computer-readable program code that generates a core-tile-switch mapping architecture on the integrated circuit chip by mapping the plurality of cores to the plurality of tiles using a mapping method, said mapping method comprising:

multiplying a data communication flow from a first one of the plurality of cores to a second one of the plurality of cores by a hop distance measured between a first one of the plurality of switches and a second one of the plurality of switches, to thereby yield a plurality of multiplication result values; and summing the plurality of multiplication result values.

3. A method of creating an optimized core-tile-switch mapping architecture in an on-chip bus, comprising:

creating a core communication graph representing a connection relationship between arbitrary cores;

creating a Network-on-chip (NOC) architecture including a plurality of switches, a plurality of tiles, and a plurality of links interconnecting the plurality of switches; and mapping the cores to the tiles using a predetermined optimized mapping method and creating the optimized core-tile-switch mapping architecture, wherein the optimized mapping method comprises:

a first step of multiplying a data communication flow from an arbitrary core s to an arbitrary core d by a hop distance between an arbitrary switch i and an arbitrary switch j, in which the values of the switches i and j are changed to the values of switches surrounding an arbitrary tile k and switches surrounding an arbitrary tile l, the multiplication is carried out for the changed values, and then the multiplication result values are summed up;

a second step of carrying out the calculation of the first step for all tiles and summing up the result values; and a third step of multiplying a communication volume from the core s to the core d by the result value of the second step, in which values of the cores s and d are changed to the values of all cores, the multiplication is carried out for the changed values, and the multiplication result values are summed up, to thereby decide the cores s and d which minimize the hop distance between the switches i and j.

4. The method of claim 3, further comprising:

a fourth step of dividing the result value of the third step by the communication volume between the cores s and d carried out for the values of all cores, to thereby decide the cores s and d which minimizes an average hop distance from the switch i to the switch j.

5. The method of claim 4, wherein the first through fourth steps assume that the switch i as one of the switches surrounding the arbitrary tile k is connected to the tile k and the arbitrary switch j as one of the switches surrounding the tile l is connected to the tile l, when the core s is mapped to the tile k and the core d is mapped to the tile l.

6. The method of claim 5, wherein the optimized mapping method is represented as follows:

$$\frac{1}{\sum_{\forall s,d} v_{sd}} \sum_{\forall s,d} v_{sd} \sum_{\forall k,l} \sum_{\forall i \in S_k, \forall j \in S_l} h_{ij} f_{skdl}^{ij}$$

where $f_{skdl}^{ij}$ is the data communication flow, $h_{ij}$ is the hop distance between the switches i and j, $S_k$ and $S_l$ respectively represent the switches surrounding the tile k and the switches surrounding the tile l, and $v_{sd}$ represents the communication volume between the cores s and d.

7. The method of claim 5, wherein the number of cores is equal to or less than the number of tiles and no more than one core is mapped to a single tile.

8. The method of claim 7, wherein a relationship between the core and the tile is represented as follows:

$$\sum_{\forall k} m_{sk} = 1, \sum_{\forall s} m_{sk} \leq 1$$

where, $$\sum_{\forall k} m_{sk} = 1$$

means that the number of tiles k mapped to the core s is 1, and $$\sum_{\forall s} m_{sk} \leq 1$$

means that the number of cores s mapped to the tile k is 1 or 0.

9. The method of claim 5, wherein the number of switches connected to a single core is from 1 to 4.

10. The method of claim 9, wherein a relationship between the cores and the switches is represented as follows:

$$m_{sk} \leq \sum_{\forall i \in S_k} m_{sk}^i \leq D_C m_{sk}$$

where $D_c$ represents the maximum number of switches connected to a single core, $m_{sk}$ is 1 if the core s is mapped to the tile k and is 0 otherwise, and $m_{sk}^i$ represents the number of switches connected to the tile k in the state that the core s is mapped to the tile k.

11. The method of claim 5, wherein the number of switches connected to a single core is from 1 to 4.

12. The method of claim 5, wherein a relationship between the cores and the switches is represented as follows:

$$0 \leq \sum_{\forall k \in T_i} \sum_{\forall s} m_{sk}^i \leq D_S$$

where $D_c$ represents the maximum number of switches connected to a single core and $m_{sk}^i$ represents the number of switches connected to the tile k in the state that the core s is mapped to the tile k.

13. The method of claim 5, wherein the data communication flow is 1 if the core s is mapped to the tile k connected to the switch i and the core d is mapped to the tile l connected to the switch j, and is 0 otherwise.

14. The method of claim 13, wherein the data communication flow is represented by the following Expression:

$$\sum_{\forall i \in S_k, \forall j \in S_l} f_{skdl}^{ij} \sum_{\forall i \in S_k, \forall j \in S_l} f_{skdl}^{ij} = 1, \text{ if } m_{sk} = 1 \text{ and } m_{d1} = 1,$$

$$\sum_{\forall i \in S_k, \forall j \in S_l} f_{skdl}^{ij} \sum_{\forall i \in S_k, \forall j \in S_l} f_{skdl}^{ij} = 0 \text{ otherwise}$$

where $m_{sk}$ represents the case where the core s is mapped to the tile k and $m_{dl}$ represents the case where the core d is mapped to the tile l.

15. The method of claim 14, wherein the Expression is represented as the following linear Expression:

$$m_{sk} + m_{dl} - 1 \leq \sum_{\forall i \in S_k, \forall j \in S_l} f_{skdl}^{ij} \leq \frac{m_{sk} + m_{dl}}{2}$$

where the middle term of the Expression is 1 if the core s is mapped to the tile k connected to the switch i and the core d is mapped to the tile l connected to the switch j.

16. The method of claim 5, wherein the bandwidth of an arbitrary link is equal to or smaller than the maximum bandwidth that can be simultaneously congested in the link, and the maximum bandwidth of the link does not exceed the link capacity.

17. The method of claim 16, wherein the bandwidth of the arbitrary link is represented as follows $$\sum_{\forall s,d} \sum_{\forall k,l} \sum_{\forall i,j} b_{sd} r_{xy}^{ij} f_{skdl}^{ij} = B_{xy}, B_{xy} \leq B_{max}, B_{max} \leq C,$$

where, $B_{xy}$ is the bandwidth of the link between arbitrary routes X and Y between the switches i and j, $b_{sd}$ denotes the bandwidth required for the data communication flow from the core s to the core d, $B_{max}$ represents the maximum bandwidth which can be simultaneously congested in the arbitrary link, and C denotes the link capacity that is the maximum data capacity which the arbitrary link can transmit.

18. The method of claim 5, wherein the NOC architecture is a two-dimensional mesh architecture.

19. A computer-readable recording medium for recording a method of creating an optimized core-tile-switch mapping architecture in an on-chip bus using a core communication graph and a Network-on-chip (NOC) architecture, the method comprising:

a first step of multiplying a data communication flow from an arbitrary core s to an arbitrary core d by a hop distance between an arbitrary switch i and an arbitrary switch j, in which the values of the switches i and j are changed to the values of switches surrounding an arbitrary tile k and switches surrounding an arbitrary tile l, the multiplication is carried out for the changed values, and then the multiplication result values are summed up;

a second step of carrying out the calculation of the first step for all tiles and summing up the result values; and a third step of multiplying a communication volume from the core s to the core d by the result value of the second step, in which values of the cores s and d are changed to the values of all cores, the multiplication is carried out for the changed values, and the multiplication result values are summed up, to thereby decide the cores s and d which minimize the hop distance between the switches i and j.

20. The computer-readable recording medium of claim 19, wherein the method of creating the core-tile-switch mapping architecture further comprises:

a fourth step of dividing the result value of the third step by the communication volume between the cores s and d carried out for the values of all cores, to thereby decide the cores s and d which minimizes an average hop distance from the switch i to the switch j.

* * * * *